United States Patent
Miyata (10) Patent No.: US 10,578,277 B2
(45) Date of Patent: Mar. 3, 2020

(54) LIGHT SOURCE DEVICE

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 242 days.

(21) Appl. No.: 15/427,571

(22) Filed: Feb. 8, 2017

(65) Prior Publication Data
US 2017/0227175 A1   Aug. 10, 2017

(30) Foreign Application Priority Data

Feb. 9, 2016   (JP) ................. 2016-023125

(51) Int. Cl.
*H01S 5/00* (2006.01)
*F21V 7/00* (2006.01)
(Continued)

(52) U.S. Cl.
CPC ........ *F21V 7/0008* (2013.01); *H01S 5/02292* (2013.01); *F21Y 2113/10* (2016.08);
(Continued)

(58) Field of Classification Search
CPC ............. H01S 5/02208; H01S 5/02216; H01S 5/0071; H01S 5/4093; H01S 5/00; H01S 5/02292; F21Y 2113/10
(Continued)

(56) References Cited

U.S. PATENT DOCUMENTS

| | | | | |
|---|---|---|---|---|
| 5,100,220 A | * | 3/1992 | Voegeli | G02B 5/08 372/99 |
| 2002/0067899 A1 | * | 6/2002 | Andersen | G02B 6/29373 385/93 |

(Continued)

FOREIGN PATENT DOCUMENTS

| JP | H07-221388 A | 8/1995 |
|---|---|---|
| JP | 2002-374030 A | 12/2002 |

(Continued)

OTHER PUBLICATIONS

Company Brochure of MSG Lithpglas GmbH; Hermetic Packaging Solutions using Borosilicate Glass Thin Films. 23 pages. MSG Lithoglas GmbH, Maria-Reiche-Str. 1, 01109 Dresden, Germany. www.lithoglas.de.

*Primary Examiner* — Tuan N Nguyen
(74) *Attorney, Agent, or Firm* — Hunton Andrews Kurth LLP (57) ABSTRACT

A light source device includes a package, one or more semiconductor lasers each having an emission surface, a light-transmissive cover, and an optical member. The package includes an inner bottom surface and inner lateral surfaces, and a recess defined by the inner bottom surface and the inner lateral surfaces and having an open end. The one or more semiconductor lasers are arranged on the inner bottom surface. The light-transmissive cover covers the open end of the recess. The optical member is arranged on an upper surface of the cover and is configured to mix light. The one or more semiconductor lasers are arranged so that their emission surfaces are respectively oblique to their adjacent inner lateral surface when viewed from above, and the inner lateral surface has a reflecting region arranged inclined with respect to the bottom surface.

17 Claims, 6 Drawing Sheets

(51) Int. Cl.
*H01S 5/022* (2006.01)
*H01S 5/40* (2006.01)
*F21Y 113/10* (2016.01)
*F21Y 115/30* (2016.01)

(52) U.S. Cl.
CPC .......... *F21Y 2115/30* (2016.08); *H01S 5/0071* (2013.01); *H01S 5/02208* (2013.01); *H01S 5/02252* (2013.01); *H01S 5/4031* (2013.01); *H01S 5/4093* (2013.01)

(58) Field of Classification Search
USPC .......................................... 372/43.01, 50.121
See application file for complete search history.

(56) References Cited

U.S. PATENT DOCUMENTS

| | | | | |
|---|---|---|---|---|
| 2002/0105981 | A1* | 8/2002 | Gen-ei | G11B 7/127 372/36 |
| 2003/0189960 | A1* | 10/2003 | Kitaoka | G02B 6/4201 372/36 |
| 2009/0021744 | A1* | 1/2009 | Akanuma | G01C 19/66 356/459 |
| 2010/0181582 | A1* | 7/2010 | Li | H01L 33/44 257/91 |
| 2010/0181583 | A1* | 7/2010 | Peter | H01L 33/04 257/94 |
| 2010/0246159 | A1* | 9/2010 | Wada | F21K 9/00 362/84 |
| 2012/0132937 | A1* | 5/2012 | Chan | H01L 25/0753 257/89 |
| 2016/0064624 | A1* | 3/2016 | Yoon | H01L 33/504 257/88 |

FOREIGN PATENT DOCUMENTS

| | | |
|---|---|---|
| JP | 2005-108985 A | 4/2005 |
| JP | 2009-019982 A | 1/2009 |
| JP | 2010-251686 A | 11/2010 |
| JP | 2011-181794 A | 9/2011 |
| WO | 2011-108038 A1 | 9/2011 |

* cited by examiner

LIGHT SOURCE DEVICE

CROSS-REFERENCE TO RELATED PATENT APPLICATION

This application claims priority to Japanese Patent Application No. 2016-023125 filed on Feb. 9, 2016. The disclosure of Japanese Patent Application No. 2016-023125 is hereby incorporated by reference in its entirety.

BACKGROUND

Technical Field

The present disclosure relates to a light source device having a semiconductor laser.

Description of Related Art

Light source devices can include a semiconductor laser. One of such a light source device has a reflecting surface formed at an angle of 45 degrees to a surface of a substrate on which a semiconductor laser is mounted, as proposed, for example, in Japanese Unexamined Patent Application Publication No. H07(1995)-221388.

SUMMARY

In the light source device described in Japanese Unexamined Patent Application Publication No. H07(1995)-221388, when light emitted from the semiconductor laser is incident on the reflecting surface, the light is reflected in a direction perpendicular to the surface of the substrate, to realize a light source device having good directivity with ease of handling.

However, in such a configuration, light is reflected at the reflecting surface and is transmitted in a direction perpendicular to the surface of the substrate, so that when an optical member configured to mix light is provided even at a light emitting side, a sufficient amount of reflection within the optical member that allows mixing of light may not occur and, thus, uniform light may be difficult to obtain. Also, even if an optical member configured to mix light is provided, in order to cause a sufficient amount of reflection to obtain uniform light, the optical member in such a configuration is needed to have a certain length in the transmitting direction of the light, resulting in a larger device and a loss in optical output.

The present invention is devised in light of such circumstances, and it is hence an object thereof to provide a light emitting device of a small size that can emit uniform light with small optical loss.

Accordingly, a light source device according to certain embodiments of the present invention includes a package, one or more semiconductor lasers each having an emission surface, a light-transmissive cover, and an optical member. The package includes an inner bottom surface and inner lateral surfaces surrounding the inner bottom surface, and a recess defined by the inner bottom surface and the inner lateral surfaces and having an open end. The one or more semiconductor lasers are arranged on the inner bottom surface. The light-transmissive cover covers the open end of the recess. The optical member is arranged on an upper surface of the cover and is configured to mix light. The one or more semiconductor lasers are arranged so that the emission surfaces are respectively oblique to their adjacent inner lateral surface when viewed from above, and the inner lateral surface has a reflecting region arranged inclined with respect to the inner bottom surface so that, in terms of the optical axis, laser light emitted from each of the one or more semiconductor laser elements is directed to pass through the cover and hit an inner surface of the optical member.

Accordingly, a light source device of a small size that can emit uniform light with small optical loss can be provided.

DETAILED DESCRIPTION

Certain embodiments of the present invention will be described below with reference to the drawings.

Light Source Device According to One Embodiment

Figure 1A:
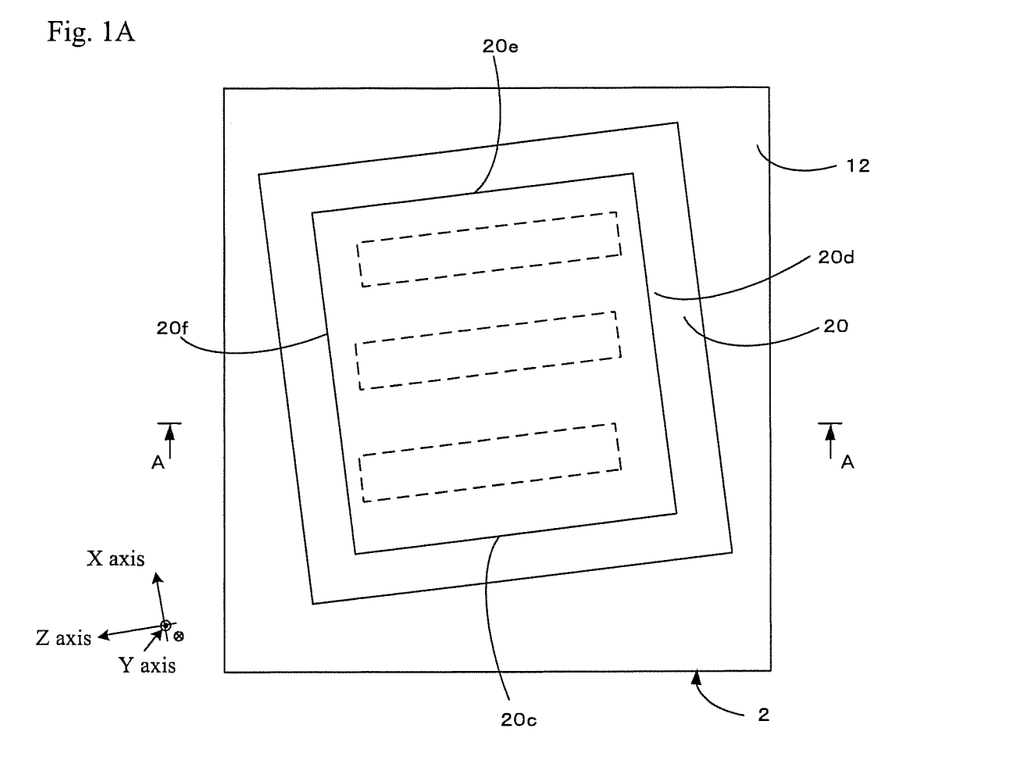
FIG. 1A is a plan view schematically showing an outer shape of a light source device according to one embodiment of the present disclosure.
Figure 1B:
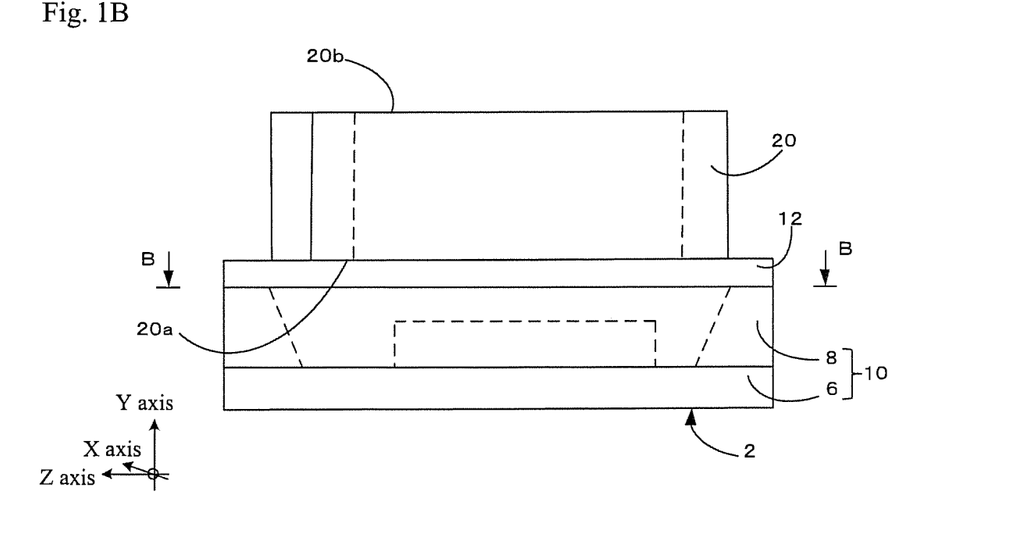
FIG. 1B is a lateral view schematically showing an outer shape of a light source device according to one embodiment of the present disclosure.
Figure 2A:
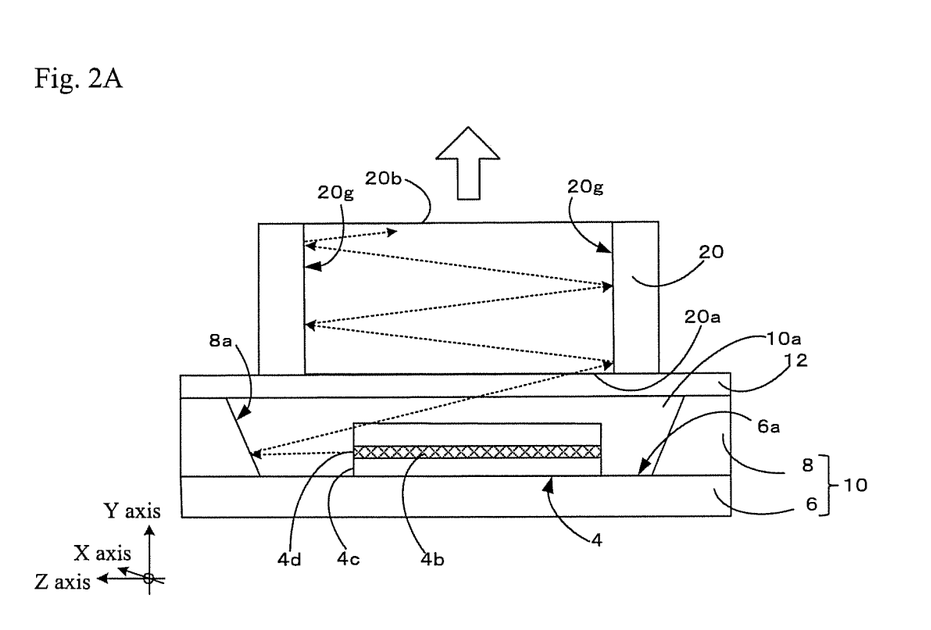
FIG. 2A is an A-A line sectional lateral view schematically showing inside of the light source device of FIG. 1A.
Figure 2B:
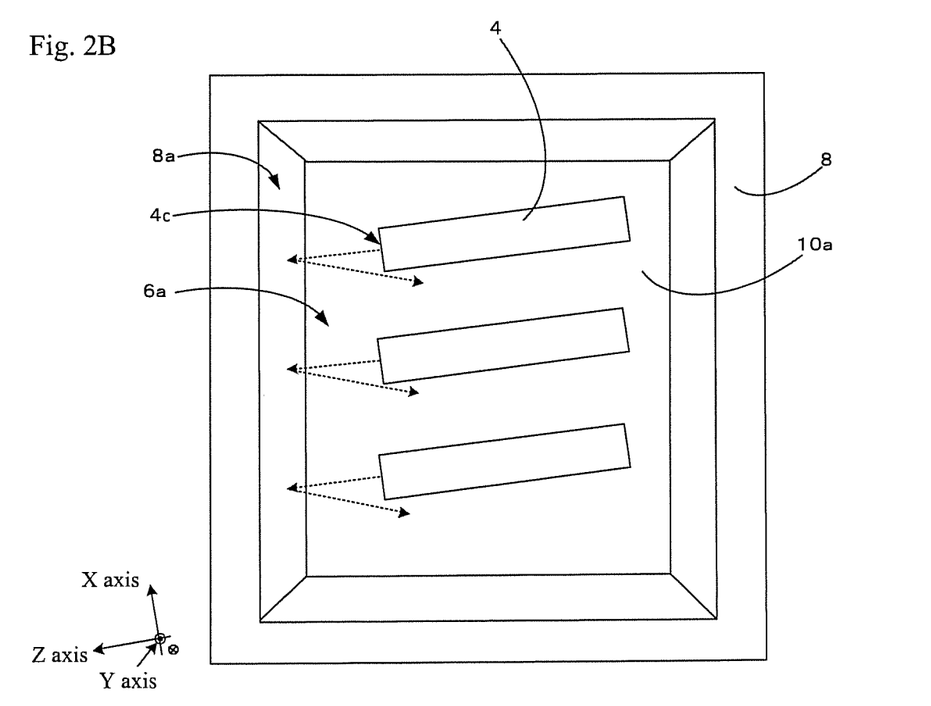
FIG. 2B is a B-B line sectional side view schematically showing inside of the light source device of FIG. 1B.

FIG. 1A is a plan view schematically showing an outer shape of a light source device 2 according to one embodiment of the present disclosure. FIG. 1B is a lateral view schematically showing an outer shape of the light source device 2. FIG. 2A is an A-A line sectional lateral view schematically showing inside of the light source device 2 of FIG. 1A. FIG. 2B is a B-B line sectional side view schematically showing inside of the light source device 2 of FIG. 1B.

The light source device 2 includes a package 10 formed with a base member 6 having an inner bottom surface 6a and a peripheral side member 8 having inner lateral surfaces 8a. The inner lateral surfaces 8a of the peripheral side member 8 are arranged surrounding the inner bottom surface 6a of the base member 6. Thus, the package 10 includes a recess 10a defined by the bottom surface 6a and inner lateral surfaces 8a and having an open end.

As shown in FIG. 2B, when the package 10 is viewed from above, the outline of the inner bottom surface 6a formed by the inner lateral surfaces 8a in contact with the inner bottom surface 6a is approximately rectangular with the sides substantially parallel to corresponding sides of substantially rectangular outer peripheral shape of the package 10 in top view. The recess 10a is an approximately rectangular tapered recess. The upper outline formed by upper ends of the inner lateral surfaces 8a that defines the open end of the recess 10a, and the lower outline formed by lower ends of the inner lateral surfaces 8a in contact with the inner bottom surface 6a are substantially parallel to the outer peripheral shape of the package 10. The base 6 that is a constituent member of the package 10 has a plate-like outer form. The peripheral side member 8 that is a constituent member of the package 10 has four inner lateral surfaces 8a defining the recess 10a. Each of the inner lateral surfaces 8a has a trapezoidal shape with narrower bottom, which is flat or curved, or a combination of both.

In the present embodiment, the base 6 and the peripheral side member 8 are discrete members which can be made of a material most suitable to their respective uses. For example, when the peripheral side member 8 is made of a silicon material and the angle of the inner lateral surfaces 8a is in conformity to the crystal orientation of silicon, the reflecting surface can be easily formed with a precise inclination angle. Meanwhile the base 6 can be made of a material of good heat dissipation.

Other than those, the peripheral side member 8 and the base 6 may be made of a same material, for example.

One or more semiconductor lasers 4 are arranged on the inner bottom surface 6a of the base 6. As shown in FIG. 2A, each of the one or more semiconductor lasers 4 has an optical waveguide (ridge optical waveguide) 4b in its main body, and an end of the optical waveguide 4b at the emission surface 4c serves as the emission region 4d. In the present embodiment, a configuration including three semiconductor lasers 4 is illustrated, but any appropriate number (inclusive of one) of semiconductor lasers 4 can be employed. As shown in FIG. 2B, when the package 10 is seen from above, each of the semiconductor lasers 4 is arranged so that its emission surface 4c is oblique to its adjacent inner lateral surface 8a. A portion of the emission surface 4c that is an end of the optical waveguide 4b serves as the emission region 4d. Accordingly, parallel relation to other surface, perpendicular relation to the optical axis, and so forth, described through the emission surface 4c can also be applied to the emission region 4d.

A light-transmissive cover 12 configured to cover the open end of the recess 10a of the package 10 is attached over the package 10. The cover 12 may have a plate-like outer form. Covering the open end of the recess 10a by the cover 12 allows the one or more semiconductor lasers 4 in an air-tight environment, so that light source device 2 of high reliability can be realized.

Further, an optical member 20 configured to mix light is arranged on an upper surface of the cover 12. In the present embodiment, a hollow light pipe 20 is employed as the optical member 20 configured to mix light. But other appropriate optical member, for example, a solid rod integrator can also be employed for the optical member 20 configured to mix light.

The optical member 20 is arranged so that one of the outer surfaces of the optical member 20 is substantially parallel to the emission surfaces 4c of the one or more semiconductor lasers 4, so that as shown in FIG. 1A, the optical member 20 is arranged not parallel, but oblique to the outer surfaces of the package 10.

In more detail, as shown in FIG. 1A and FIG. 1B, the optical member 20 has an approximately rectangular parallelepiped shape with an incident surface 20a and a light emission surface 20b that are substantially parallel to each other, and four lateral surfaces 20c, 20d, 20e, and 20f that connect the incident surface 20a and the light emission surface 20b. Further, two lateral surfaces 20c and 20e of the optical member 20 are arranged substantially parallel to the optical axis of the light emitted from the one or more semiconductor lasers 4, and two lateral surfaces 20d and 20f of the optical member 20 are arranged substantially parallel to the emission surface 4c of the one or more semiconductor lasers 4. The inner lateral surfaces 20g of the optical member 20 that is a hollow light pipe are formed also substantially parallel to the lateral surfaces 20c, 20d, 20e, and 20f, respectively.

Now, the materials of the constituent members of the light source device 2 will be described below.

For the base 6, for example, a ceramic material, a resin material, or the like can be employed. For the peripheral side member 8, a silicon material as described above can be employed, but another appropriate material, for example, a resin material, or a ceramic material, or a metal material having an insulating film disposed on its surface, can also be employed. For the material of the light-transmissive cover 12, for example, a glass material or a resin material can be employed. For the material of the optical member 20 such as a light pipe or a rod integrator, for example, a glass material or a resin material can be employed.

In FIG. 2A and FIG. 2B, propagating directions of light emitted from the one or more semiconductor lasers 4 is schematically shown by dotted arrow lines. As shown in FIG. 2A, the inner lateral surface 8a has a reflecting region arranged inclined with respect to the inner bottom surface 6a so that, in terms of the optical axis, laser light emitted from each of the one or more semiconductor laser elements 4 is directed to pass through the cover 12 and hit an inner surface 20g of the optical member 20.

The inner lateral surface 8a has the reflecting region inclined to the inner bottom surface 6a, so that light emitted from the one or more semiconductor lasers 4 is reflected at the reflecting region of the inner lateral surface 8a and directed to hit the inner surface 20g of the optical member 20. In this case, the inner surface of the optical member 20 is configured to serve as a light-reflecting surface. When the optical member 20 is a light pipe, the inner surface 20g exposed to its inner space corresponds to the inner surface, and when the optical member 20 is a rod integrator, the outer surface of the rod integrator corresponds to the inner surface.

Thus, light emitted from the semiconductor laser 4 is guided to hit the inner surface 20g of the optical member 20. In other words, the light directed to the optical member is obliquely incident on the incident surface 20a. This can also be referred to that: the light is directed incident on the incident surface 20a of the optical member 20, at an angle offset from the Y-axis.

As shown in FIG. 2A, the light reflected at the inner lateral surface 8a is incident on the incident surface 20a of the optical member 20 at an angle that allows light to hit the inner surface 20g of the optical member 20. The light is then propagated upward in the figure while being repetitively reflected at the inner surfaces 20g of the optical member 20 and transmitted from the light emission surface 20b of the optical member 20. Light transmitted from the optical member 20 is the output light of the light source device 2. The output light is shown by a white arrow.

In this configuration, the light from the one or more semiconductor lasers 4 is repetitively reflected at the inner surfaces 20g of the optical member 20, so that even when the optical member 20 has a relatively small length in axial direction, mixing of light can be sufficiently achieved and uniform light can be emitted. Thus, the light emitting device 2 of a small size and that can emit uniform light with small optical loss can be realized.

In order to cause repetitive reflection at the inner surfaces 20g of the optical member 20, light reflected at the reflecting region of the inner lateral surface 8a is preferably directed in a direction at a small angular deviation (that is, a small elevation angle) from the optical axis of the waveguide of respective semiconductor lasers 4. However, in this case, as shown by dotted arrow lines in FIG. 2A, a portion of light reflected at the reflecting region of the inner lateral surface 8a may hit the semiconductor laser 4. This results in a loss of optical output in the light incident from the semiconductor laser 4.

Accordingly, in the present embodiment, as shown in FIG. 2B, when the package 10 is seen from above, each of the semiconductor lasers 4 is arranged so that its emission surface 4c is not parallel but oblique to its adjacent inner lateral surface 8a. In other words, each of the one or more semiconductor lasers 4 are arranged so that the optical axis of the light emitted from the semiconductor laser 4 is aligned not perpendicular to but at an oblique angle relative to its adjacent inner lateral surface 8a.

With this arrangement, when the light is reflected at the reflecting region of the inner lateral surface 8a, an angle in a same plane but deviated from the optical axis of the optical waveguide will be added to an upward angle, so that the reflected light can be efficiently prevented from hitting the semiconductor laser 4. Accordingly, loss in the optical output in the light emitted from the one or more semiconductor lasers 4 can be reduced.

As described above, when the package 10 is viewed from above, the inner lateral surface 8a has a reflecting region arranged inclined with respect to the inner bottom surface 6a so that, in terms of the optical axis, laser light emitted from each of the one or more semiconductor laser elements 4 hits the inner surface 20a of the optical member 20. Also, when the package 10 is viewed from above, the emission surface 4c of each of the one or more semiconductor lasers 4 is oblique to its adjacent inner lateral surface 8a. Accordingly, the light emitting device 2 of a small size and that can emit uniform light with small optical loss can be realized.

Further, when each of the one or more semiconductor lasers 4 includes a substrate and a semiconductor multilayer film and is mounted on the inner bottom surface 6a with the semiconductor multilayer film side facing the inner bottom surface 6a, the optical waveguide 4b is located closer to the inner bottom surface 6a. This arrangement likely causes a portion of reflected light hitting the semiconductor laser 4, as seen in a lateral view, but in the present embodiment, the emission surface 4c of each semiconductor laser 4 is arranged oblique to the inner lateral surface 8a. Thus, optical loss can be reduced efficiently.

In the present embodiment, the emission surfaces 4c of the one or more semiconductor lasers 4 are arranged substantially perpendicular to the inner bottom surface 6a of the recess. Thus, the optical axis of the light emitted from the each of the one or more semiconductor lasers 4 is substantially parallel to the inner bottom surface 6a and is indicated as Z-axis in the figures. The short axis direction (short axis direction of far field pattern) of light emitted from each semiconductor laser 4 is substantially parallel to the inner bottom surface 6a and perpendicular to the Z-axis and is indicated as X-axis in the figures. The long axis direction (long axis direction of far field pattern) of light emitted from each semiconductor laser 4 is substantially perpendicular to the inner bottom surface 6a and is indicated as Y-axis in the figures.

Further, when a plurality of semiconductor lasers 4 that includes blue-light emitting, green-light emitting, and red-light emitting semiconductor lasers is employed, a light source device that can emit white light can be realized.

The wavelength of blue light emitted from a blue semiconductor laser may be in a range of 420 to 480 nm, the wavelength of green light emitted from a green semiconductor laser may be in a range of 500 to 540 nm, and the wavelength of red light emitted from a red semiconductor laser may be in a range of 600 to 680 nm.

Of the light source device 2 having a configuration as described above, angles of the inner lateral surface 8a and semiconductor laser 4 will be described in more detail with reference to FIG. 3 to FIG. 5 below.

Inclination Angle of Inner Lateral Surface 8a to Bottom Surface 6a

Figure 3:
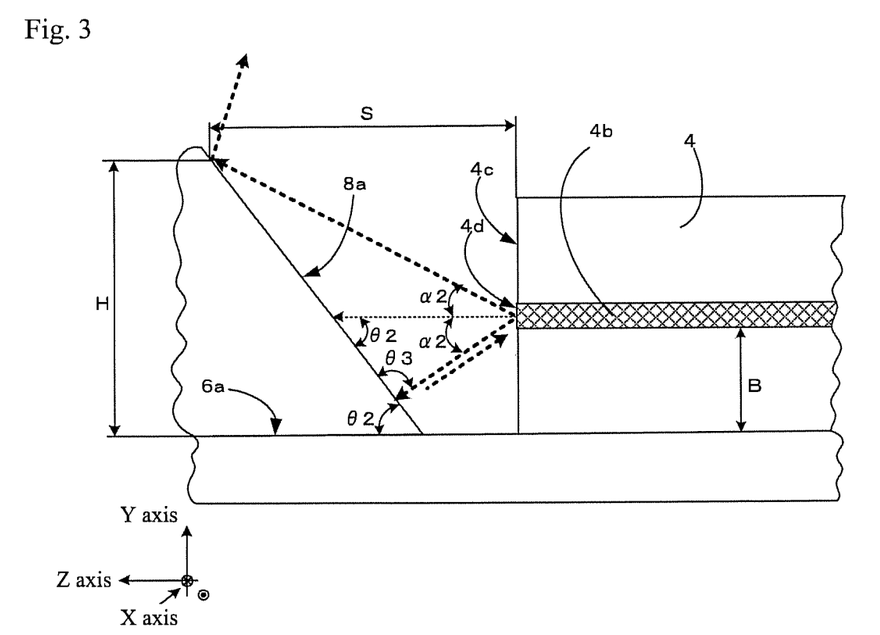
FIG. 3 is a side view schematically showing inclination angles of one of lateral surfaces with respect to a bottom surface of a recess of a package, and propagation of light.

FIG. 3 is a lateral view schematically showing inclination angles of one of inner lateral surfaces 8a with respect to an inner bottom surface 6a of a recess 10a of a package 10, and propagation of light.

In FIG. 3, when the inner lateral surface 8a having a reflecting region is inclined to the inner bottom surface 6a at an inclination angle $\theta 2$ (i.e., $\theta 2$ is the value of subtracting the angle between the inner lateral surface 8a and the inner bottom surface 6a from 180 degrees), the optical axis of the semiconductor laser 4 and the inner bottom surface 6a are substantially parallel to each other (in Z-axis direction), so that the angle between the inner lateral surface 8a and the optical axis of the semiconductor laser 4 is also $\theta 2$.

The divergence angle of light emitted from the one or more semiconductor lasers 4 in a long-axis (Y-axis direction) direction is indicated as $\alpha 2$. The divergence angle can be defined as an angle between light at 50% intensity in optical intensity distribution on far field pattern (i.e., intensity satisfying a range of half band width obtained by Gaussian fitting the beam profile) and the optical axis. The divergence angle can also be defined as an angle between light at $1/e^2$ intensity in optical intensity distribution on far field pattern (i.e., intensity satisfying a range of $1/e^2$ obtained by Gaussian fitting the beam profile in a similar manner as that above) and the optical axis.

Light emitted from the semiconductor laser 4 with a lower divergence angle $\alpha 2$ is shown by bold dotted arrow lines in FIG. 3. As shown in FIG. 3, the triangle having the segments of the lower emission with a divergence angle $\alpha 2$, the optical axis of emission from the semiconductor laser 4, and the reflection region of the inner lateral surface 8a has apex angles of $\alpha 2$, $\theta 2$, and $\theta 3$, which satisfy $\alpha 2+\theta 2+\theta 3=180°$.

If $\theta 3=90°$, that is, in the case of $\alpha 2+\theta 2=90°$, the triangle is a right-angled triangle and the lower emission with the divergence angle $\alpha 2$ is perpendicularly incident in the reflecting region of the inner lateral surface 8a. Accordingly, the light is perpendicularly reflected at the reflecting region of the inner lateral surface 8a and returns to its initial emission position of the semiconductor laser 4.

If the value of $\alpha 2+\theta 2$ is less than 90° (that is, $\theta 3$ is greater than 90°), since a single semiconductor laser 4 has a constant value of $\alpha 2$, the value of $\theta 2$ decreases. In other words, the inner lateral surface 8a is at a greater obtuse angle to the inner bottom surface 6a, and the light emitted from the semiconductor laser 4 is reflected at the reflecting region of the inner lateral surface 8a in a direction upwardly deviated from its initial emission position. Thus, the light reflected at the reflecting region of the inner lateral surface 8a is incident to the incident surface 20a of the optical member 20 in a direction closer to being perpendicular. Accordingly in order to obtain sufficient mixing of light, the length of the optical member 20 needs to be increased.

When the value of $\alpha 2+\theta 2$ is greater than 90° (that is, $\theta 3$ is less than 90°), the inner lateral surface 8a is at a greater acute angle to the inner bottom surface 6a, and the light emitted from the semiconductor laser 4 is reflected at the reflecting region of the inner lateral surface 8a in a direction downwardly deviated from its initial emission position. Thus, the light reflected at the reflecting region of the inner lateral surface 8a is largely obliquely incident to the incident surface 20a of the optical member 20. Accordingly sufficient mixing of light can be obtained even when the optical member 20 has a short length.

As described above, by adjusting to satisfy $\alpha 2+\theta 2 \geq 90°$, the light emitting device 2 of a small size that can emit uniform light with small optical loss can be realized more efficiently. In this case, when the package 10 is viewed in a lateral direction, the inner lateral surface 8a is arranged so that when the light emitted with a divergence angle $\alpha 2$ is reflected at the inner lateral surface 8a, a portion of the reflected light hits the semiconductor laser 4.

In FIG. 3, the height of the inner lateral surface H can be determined by the distance S between the top end of the inner lateral surface 8a and a plane including the emission surfaces 4c of the one or more semiconductor lasers 4, the distance B between the inner bottom surface 6a and the emission surfaces 4c of the one or more semiconductor lasers 4, and the divergence angle $\alpha 2$ in the long axis direction of light emitted from each of the one or more semiconductor lasers 4.

That is, $H \geq S \cdot \tan(\alpha 2)+B$ is preferably satisfied. Accordingly, the package 10 having a sufficient reflecting region without a need for extra height can be realized.

Figure 4:
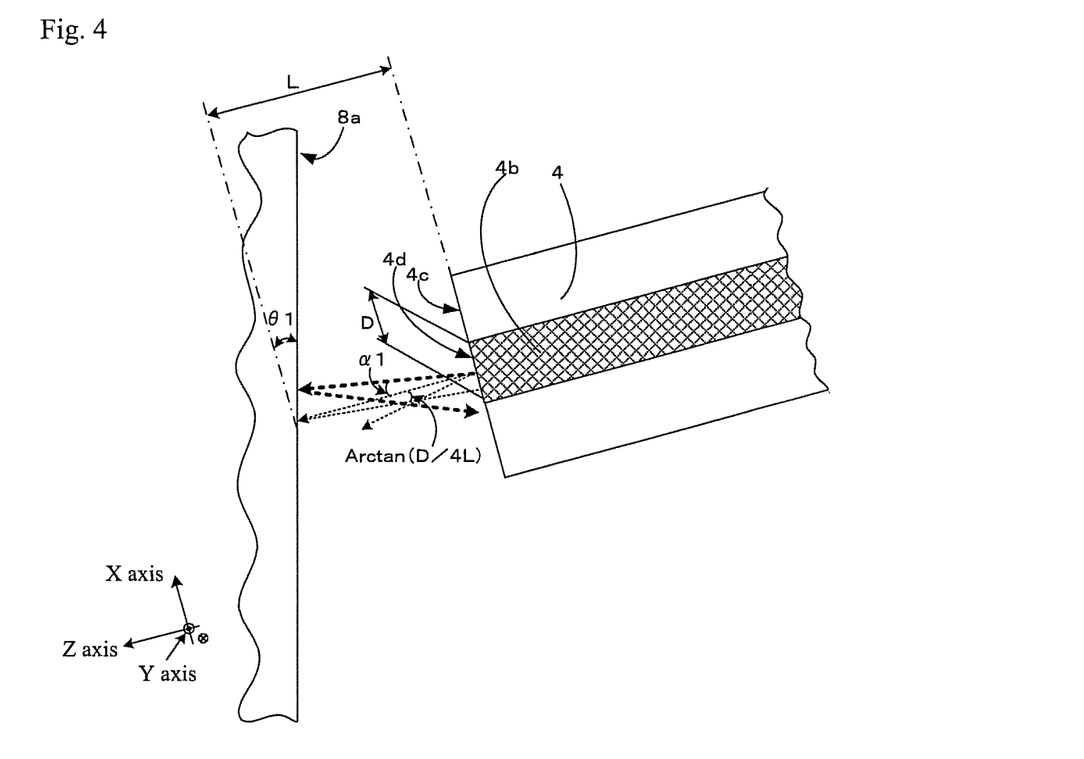
FIG. 4 is a plan view schematically showing an inclination angle of an emitting end surface of a semiconductor laser with respect to one of lateral surfaces defining a recess, and illustrating propagation of light.

Inclination Angle of Emission Surface 4c of Semiconductor Laser 4 to Inner Lateral Surface 8a FIG. 4 is a plan view seen from above schematically showing an inclination angle of an emitting end surface 4c of a semiconductor laser 4 with respect to one of inner lateral surfaces 8a defining a recess, and illustrating propagation of light. FIG. 5 is a diagram illustrating conditions that allow laser light emitted from a semiconductor laser 4 to be reflected at the inner lateral surface 8a in outward directions rather than reflected toward the emission region at the emission surface 4c of the semiconductor laser 4 or toward the main body of the semiconductor laser 4.

Figure 5:
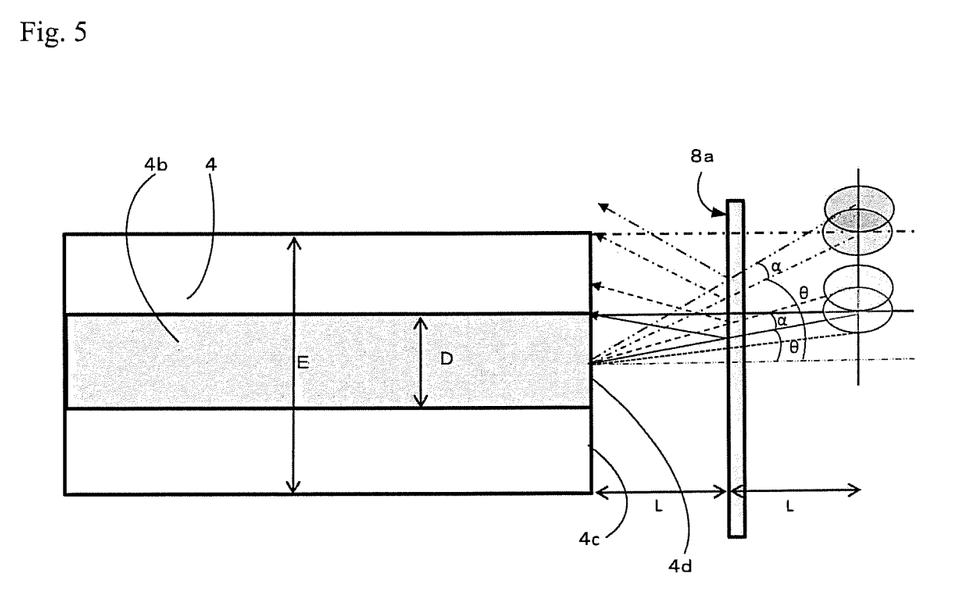
FIG. 5 is a diagram illustrating conditions that allow laser light emitted from a semiconductor laser to be reflected at a lateral surface in outward directions rather than reflected toward the emission region at the emission surface of the semiconductor laser or toward the main body of the semiconductor laser.

First, with reference to FIG. 5, general conditions are shown to guide the light reflected at the inner lateral surface 8a in a direction away from the emission region 4d or emission surface 4c of the one or more semiconductor lasers 4.

In FIG. 5, an inclination angle of the emission region 4d of the one or more semiconductor lasers 4 to its adjacent inner lateral surface 8a is $\theta$, a distance between the emission region 4d in the optical axis of light emitted from the one or more semiconductor lasers 4 and the inner lateral surface 8a having the reflecting region is L, a size (may also be referred to as "ridge width") of the emission region 4d of the one or more semiconductor lasers 4 is D, a size of the emission surface 4c of the one or more semiconductor lasers is E, and a divergence angle of the light emitted from the one or more semiconductor laser 4 is $\alpha$. In FIG. 5, the conditions to be described below can be applied to either short-axis direction or long-axis direction, and the description in the short-axis direction (when the package 10 is viewed from above) will be given below. In FIG. 5, for the sake of illustrating four different positional relationships, the emission surface 4c (inclusive of the emission region 4d) of the semiconductor laser 4 is shown arranged substantially parallel to the inner lateral surface 8a, but the semiconductor laser 4 is arranged oblique to the inner lateral surface 8a. That is, the semiconductor laser 4 is arranged oblique to the inner lateral surface 8a while the optical axes of emission from the semiconductor laser 4 shown by the solid line, the dotted line, the alternate long and short dashed line, and the alternate long and two short dashed line are respectively perpendicular to the emission surface 4c in the four locational relationships to be described below.

The solid arrow line in FIG. 5 shows propagation of light, when the emission of the semiconductor laser 4 on the optical axis is reflected to an outer edge of the emission region 4d of the semiconductor laser 4. In this case, the inclination angle $\theta$ satisfies $\theta=\text{Arctan}$(a half value of size $D/2L)=\text{Arctan}(D/4L)$. Accordingly, when the inclination angle $\theta 1$ satisfies $\theta 1>\text{Arctan}(D/4L)$, the emission of the semiconductor laser 4 on the optical axis of the semiconductor laser 4 is reflected in a direction away from the emission region 4d of the semiconductor laser 4.

The dotted arrow line in FIG. 5 shows emission of the semiconductor laser 4 with a divergence angle of $\alpha$ is reflected to an outer edge of the emission region 4d of the semiconductor laser 4. In this case, the inclination angle $\theta$ satisfies $\theta=\text{Arctan}$(a half value of size $D)/2L=\text{Arctan}(D/4L)+\alpha$. Accordingly, when the inclination angle $\theta 1$ satisfies $\theta 1 >\text{Arctan}(D/4L)+\alpha$, the emission of the semiconductor laser 4 with a divergence angle of $\alpha$ is reflected in a direction away from the emission region 4d of the semiconductor laser 4.

The dash-dot arrow line in FIG. 5 shows propagation of light, when the emission of the semiconductor laser 4 on the optical axis is reflected to an outer edge of the emission region 4c of the semiconductor laser 4. In this case, the inclination angle $\theta$ satisfies $\theta=\text{Arctan}$(a half value of size $E)/2L=\text{Arctan}(E/4L)$. Accordingly, when the inclination angle $\theta$ satisfies $\theta>\text{Arctan}(E/4L)$, the emission of the semiconductor laser 4 on the optical axis of the semiconductor laser 4 is reflected in a direction away from the emission region 4c of the semiconductor laser 4.

The dash-dot-dot arrow line in FIG. 5 shows emission of the semiconductor laser 4 with a divergence angle of $\alpha$ is reflected to an outer edge of the emission region 4c of the semiconductor laser 4. In this case, the inclination angle $\theta$ satisfies $\theta=\text{Arctan}$(a half value of size $E)/2L+\alpha=\text{Arctan}(E/4L)+\alpha$. Accordingly, when the inclination angle $\theta$ satisfies $\theta>\text{Arctan}(E/4L)+\alpha$, the emission of the semiconductor laser 4 with a divergence angle of $\alpha$ is reflected in a direction away from the emission region 4c of the semiconductor laser 4.

Next, the general conditions shown in FIG. 5 are applied to a case of viewing the package 10 from above, as shown in FIG. 4. In FIG. 4, when the semiconductor laser 4 is viewed from above, an inclination angle $\theta 1$ of the emission surface 4c with respect to its adjacent inner lateral surface 8a is $\theta 1$, a distance between the emission surface 4c and the inner lateral surface 8a that has the reflecting region is L, a size (may also be referred to as "ridge width") of light emitted from the semiconductor laser in a short axis direction (X-axis direction) of the emission region 4d at the emission surface 4c is D, and a divergence angle of light emitted from the semiconductor laser 4 in a short axis direction (X-axis direction) is $\alpha 1$.

When the general conditions shown in FIG. 5 are applied, when the angle $\theta 1$ satisfies $\theta 1>\text{Arctan}(D/4L)+\alpha$, the emission of the semiconductor laser 4 with a divergence angle of $\alpha 1$ is reflected in a direction away from the emission region 4d of the semiconductor laser 4.

As described above, when the package 10 is seen from its lateral side, and when $(\alpha 2+\theta 2) \geq 90°$ is satisfied, the light emitting device 2 of a small size that can emit uniform light with small optical loss can be realized, but when the emission with a divergence angle α2 is reflected at the reflecting region of the inner lateral surface 2a, a portion of the reflected light will hit the semiconductor laser 4. However, when the package 10 is viewed from above, the inclination angle θ1 satisfies θ1>Arctan(D/4L)+α1, so that the emission of the semiconductor laser 4 with a divergence angle of α1 is reflected in a direction away from the emission region 4d of the semiconductor laser 4, so that optical loss can be reduced. Accordingly, a light source device of a small size and that can emit uniform light with small optical loss can be provided.

Emission of the semiconductor laser 4 has a divergence angle α1 in the short axis direction smaller than a divergence angle α2 in the long axis direction, allowing for a reduction in the angle θ1 that satisfies θ1>Arctan(D/4L)+α1. The angle θ1 is preferably in a range of 3° to 15°, more preferably in a range of 5° to 10°.

When the peripheral side member 8 of the package 10 is formed with a silicone material, smooth etch surfaces with highly precise angles along crystal directions can be obtained by anisotropic etching. Accordingly, the inner lateral surfaces 8a with a precise inclination angle can be formed at a low cost.

The peripheral side member preferably has the inner lateral surfaces 8a of silicon (111) plane. When a silicon (111) plane is employed for the inner lateral surface 8a, the angle formed by the inner lateral surface 8a and the bottom surface 6a is 125.3 degrees. Thus, the angle θ2 satisfies θ2=54.7°. When the divergence angle α2 of the semiconductor laser 4 in the long axis direction exceeds 35 degrees, the condition of α2+θ2≥90° is satisfied. Such a peripheral side member 8 can be obtained by etching silicon that has a principle surface of (100) plane to form inclined surfaces of crystal planes of (111) plane.

According to the divergence angle of the semiconductor laser 4, a different crystal plane of the silicon material can be employed for the inner lateral surfaces 8a. When a plane that is not a crystal surface is employed for the inner lateral surfaces, the reflecting region arranged in the inner lateral surface may be provided with aluminum, a silver film, a dielectric film, or the like.

Light Source Device According to Another Embodiment

Figure 6:
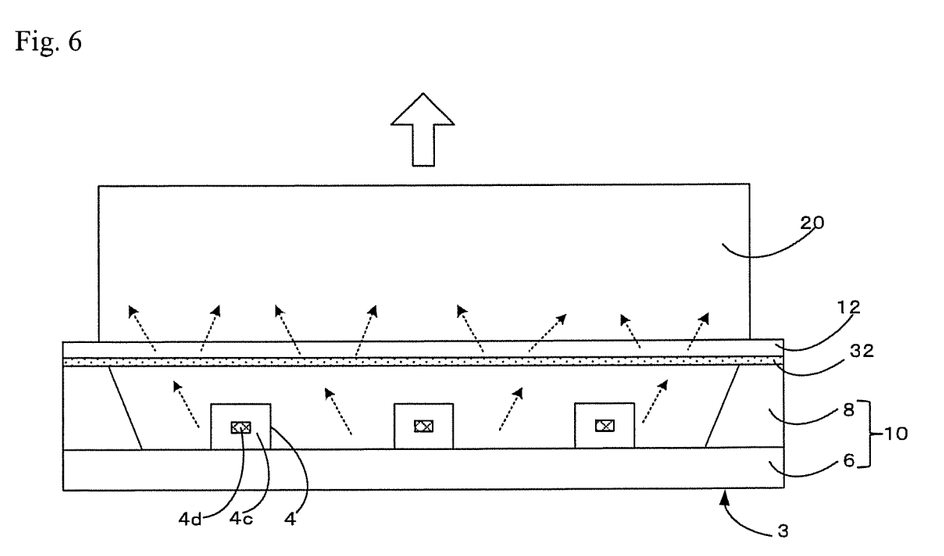
FIG. 6 is a sectional lateral view schematically showing a light source device according to another embodiment of the present disclosure.

FIG. 6 is a schematic lateral cross-sectional view showing a light source device 3 according to another embodiment of the present disclosure. Next, the light source device 3 shown in FIG. 6 will be described.

The light source device 3 according to the present embodiment has a configuration similar to the light source device 2 of the embodiment shown in FIG. 1A to FIG. 2B, except that, unlike the cover 12 according to the embodiment shown in FIG. 1A to FIG. 2B that has a plate-like shape, a light diffusing layer 32 is formed at the incident surface side of the cover 12 in the present embodiment. Description of similar configuration will be appropriately omitted.

In the present embodiment, light can be diffused by the light diffusing layer 32, so that the angle of propagation of light can be increased before the light is incident on the optical member 20. Thus, of the light emitted from the semiconductor laser 4, substantially uniform light can be outputted by using the optical member 20 with a relatively short length, particularly in the light that is diffused in the short axis direction.

In the embodiment shown in FIG. 6, the light diffusing layer 32 is disposed on the cover 12, but alternatively, the light diffusing member can be provided in another discrete optical member.

While the present invention has been described according to the embodiments and the aspects with a certain degrees of details, contents of disclosure of the embodiments and aspects shall be varied in details of the configuration, and the combination of elements and the change of order in the embodiments and aspects can be realized without deviating from the scope of the claims and contents of the present invention.

What is claimed is:

1. A light source device comprising:
a package with a recess defined by an inner bottom surface and inner lateral surfaces surrounding the inner bottom surface;
one or more semiconductor lasers arranged on the inner bottom surface;
a light-transmissive cover covering the recess of the package; and
an optical member arranged on the light-transmissive cover and configured to mix light; wherein
the inner lateral surfaces respectively have a reflecting region inclined with respect to the inner bottom surface to reflect light emitted from the one or more semiconductor lasers such that the reflected light is incident on an inner surface of the optical member through the cover, and
when viewed from above, each of the one or more semiconductor lasers has an emission surface inclined with respect to the inner lateral surfaces adjacent to the emission surface, said inner lateral surfaces reflecting a light emitted from the one or more semiconductor lasers, the light emitted from the one or more semiconductor lasers directly entering said inner lateral surfaces
wherein when an inclination angle of the inner lateral surfaces to the inner bottom surface is θ2 and a divergence angle of the light emitted from each of the one or more semiconductor laser in a long axis direction of a far field pattern is α2, a relationship of α2+θ2≥90° is satisfied, and
wherein the divergence angle is an angle between a light at 50% intensity in optical intensity distribution on far field pattern and the optical axis.

2. The light source device according to claim 1, wherein, when viewed from above, and when an inclination angle of the emission surface of each of the one or more semiconductor laser with respect to one of the inner lateral surfaces is θ1, a distance between the emission surface and the inner lateral surface that has the reflecting region is L, a size of light emitted from each of the one or more semiconductor lasers in a short axis direction of a far field pattern of an emission region at the emission surface is D, and a divergence angle of light emitted from each of the one or more semiconductor lasers in the short axis direction is α1, a relationship of θ1 >Arc tan(D/4L)+α1 is satisfied.

3. The light source device according to claim 2, wherein the divergence angle is an angle between a light in a range of 1/e² obtained by Gaussian fitting the beam profile on far field pattern and the optical axis.

4. The light source device according to claim 3, wherein the one or more semiconductor lasers are a plurality of semiconductor lasers that includes blue-light emitting, green-light emitting, and red-light emitting semiconductor lasers.

5. The light source device according to claim 3, wherein the inner lateral surfaces defining the recess of the package are of silicon (111) planes and an angle between each of the inner lateral surfaces and the inner bottom surface is 125.3 degrees.

6. The light source device according to claim 2, wherein the one or more semiconductor lasers are a plurality of semiconductor lasers that includes blue-light emitting, green-light emitting, and red-light emitting semiconductor lasers.

7. The light source device according to claim 2, wherein the one or more semiconductor lasers are a plurality of semiconductor lasers that includes blue-light emitting, green-light emitting, and red-light emitting semiconductor lasers.

8. The light source device according to claim 2, wherein the one or more semiconductor lasers each comprises a substrate and a semiconductor multilayer film, and mounted on the inner bottom surface with the semiconductor multilayer film side facing the inner bottom surface.

9. The light source device according to claim 2, wherein the inner lateral surfaces defining the recess of the package are of silicon (111) planes and an angle between each of the inner lateral surfaces and the inner bottom surface is 125.3 degrees.

10. The light source device according to claim 9, wherein the one or more semiconductor lasers are a plurality of semiconductor lasers that includes blue-light emitting, green-light emitting, and red-light emitting semiconductor lasers.

11. The light source device according to claim 2, wherein when an inclination angle of the inner lateral surfaces to the inner bottom surface is $\theta 2$ and a divergence angle of the light emitted from each of the one or more semiconductor laser in a long axis direction of a far field pattern is $\alpha 2$, a relationship of $\alpha 2 + \theta 2 \geq 90°$ is satisfied.

12. The light source device according to claim 11, wherein the one or more semiconductor lasers are a plurality of semiconductor lasers that includes blue-light emitting, green-light emitting, and red-light emitting semiconductor lasers.

13. The light source device according to claim 1, wherein the one or more semiconductor lasers are a plurality of semiconductor lasers that includes blue-light emitting, green-light emitting, and red-light emitting semiconductor lasers.

14. The light source device according to claim 1, wherein the one or more semiconductor lasers each comprises a substrate and a semiconductor multilayer film, and mounted on the inner bottom surface with the semiconductor multilayer film side facing the inner bottom surface.

15. The light source device according to claim 14, wherein the one or more semiconductor lasers are a plurality of semiconductor lasers that includes blue-light emitting, green-light emitting, and red-light emitting semiconductor lasers.

16. The light source device according to claim 1, wherein the inner lateral surfaces defining the recess of the package are of silicon (111) planes and an angle between each of the inner lateral surfaces and the inner bottom surface is 125.3 degrees.

17. The light source device according to claim 16, wherein the one or more semiconductor lasers are a plurality of semiconductor lasers that includes blue-light emitting, green-light emitting, and red-light emitting semiconductor lasers.

* * * * *